United States Patent

Meuleman

[15] 3,646,407

[45] Feb. 29, 1972

[54] RADIATION DETECTOR HAVING A SEMICONDUCTOR CRYSTAL

[72] Inventor: Johannes Meuleman, Caen, France

[73] Assignee: U.S. Philips Corporation, New York, N.Y.

[22] Filed: Sept. 21, 1970

[21] Appl. No.: 73,857

[52] U.S. Cl. ....................317/234 R, 317/234 G, 317/235 N, 250/83, 250/83.3, 62/514

[51] Int. Cl. ..........................................H01l 3/00, H01l 5/00

[58] Field of Search .................317/234, 235, 274.5; 62/514, 62/514 A; 329/203, 204, 205; 250/71.5, 80, 83.3; 313/281, 282, 283, 284, 285, 286, 287; 117/1

[56] References Cited

UNITED STATES PATENTS

| | | | |
|---|---|---|---|
| 2,500,355 | 3/1950 | Haas | 313/282 X |
| 2,567,874 | 9/1951 | Cage | 313/283 X |
| 3,255,351 | 6/1966 | Walsh et al. | 250/83 |
| 3,436,539 | 4/1969 | Wilcox | 250/83.3 |
| 3,524,985 | 8/1970 | Sayres | 250/83.3 |
| 3,546,459 | 12/1970 | Higatsberger | 317/235 N |

*Primary Examiner*—John W. Huckert
*Assistant Examiner*—Andrew J. James
*Attorney*—Frank R. Trifari

[57] ABSTRACT

A radiation detector in which a semiconductor crystal having a substantially central cavity is used around which a radiation-sensitive junction is provided between two zones of opposite conductivity-types which may be separated by an intrinsic zone, said crystal being accommodated in a hermetically sealed envelope consisting of a boxlike holder and a cover, in which connection means for the crystal on the envelope consist of a rigid pin which is connected to the boxlike holder, said pin being guided between the aperture of the crystal and forcibly pressing therein against the wall of the cavity.

7 Claims, 2 Drawing Figures

Figure 1:
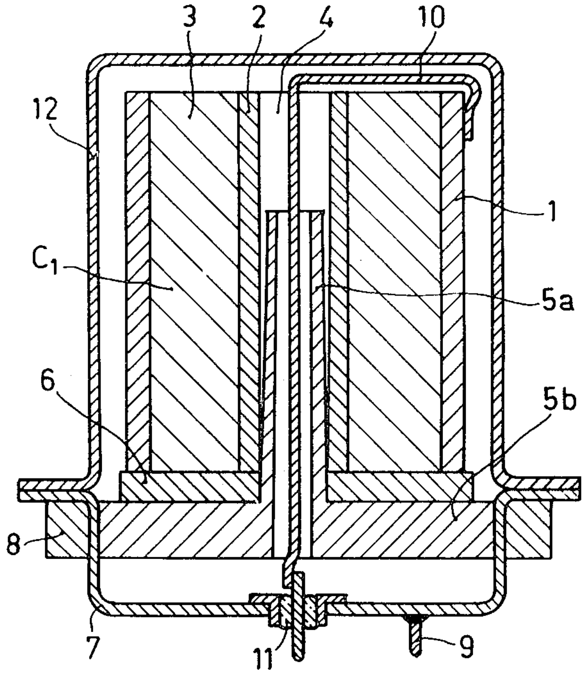

INVENTOR.
BY JOHANNES MEULEMAN
AGENT

RADIATION DETECTOR HAVING A SEMICONDUCTOR CRYSTAL

The invention relates to a radiation detector comprising on the one hand a semiconductor crystal in which a substantially central cavity is present around which a radiation-sensitive junction is provided between two zones of opposite conductivity types which may be separated by an intrinsic zone and comprising on the other hand a hermetically sealed envelope consisting a boxlike holder and a cover in which the crystal is secured.

The progress of the field of the manufacture of semiconductor materials makes it possible to obtain rods of a monocrystalline material of ever increasing dimensions. This is of importance in particular to obtain semiconductor detectors having a radiation-sensitive junction which is formed between two coaxial layers of an opposite conductivity type, for which detectors it has always been endeavoured to increase the effective volume so as to increase the efficiency. The crystal of said detectors may be cylindrical, have the shape of a parallelepiped or a prism, in which the axis of the junction coincides with the axis of the crystal.

It is known that in order to simplify the transport, the storage and the maintenance of the quality for a long time, the semiconductor must preferably be protected by a closed envelope which prevents any contamination. This is necessary in particular for detectors of germanium which have an intrinsic region which is present between the coaxial layers of opposite conductivity types and which are compensated with lithium and which can be used at a temperature approximately equal to that of liquid nitrogen and can be stored also at a very low temperature.

The increase in the effective volume of the crystal of the detector impedes the connection and the centering in the envelope as a result of its weight. The crystal tends either to rotate about its own axis, in particular when using a cylindrical crystal, or to shift which generally has for its result that the electric connection is interrupted. In addition said increase in volume and weight of the detector crystal makes it necessary to increase the rigidity of the envelope which so far has been solved by choosing the thickness of the walls of the envelope to be larger. Since said walls generally are of metal the phenomenon of retrodiffusion or reemission occurs when the rays impinge upon the walls.

It is the object of the invention to solve these problems. In order to achieve this, according to the invention, the means for securing the crystal in the envelope consist of a rigid pin which is secured to the boxlike holder, said pin being introduced in the cavity of the crystal and pressing therein forcibly against the wall of the cavity. Such a connection has advantages in particular in special applications, notably in the case in which the lateral surfaces of the crystal of the detector must be situated entirely freely, so that they can receive all the rays whatever their position is, for example, in the case of application as probes. In addition, the pin makes it possible to obtain in a simple manner an excellent centering of the detector in the envelope. The method of connection described may be used independently of the type of detectors, for example, in a cylindrical form, the form of a parallelepiped and preferably with a square cross secton, a prismatic form having a trapezoidal form and in all kinds of circumstances of the atmosphere, for example, a high vacuum and low temperature.

In an embodiment of the invention, the end of the pin present outside the cavity may be rigidly secured to a disk which extends at right angles to the pin and is secured to the boxlike holder. This embodiment avoids the necessity of having to secure the detector to the sidewalls of the crystal and hence on the one hand to leave the entire lateral surface free and on the other hand to prevent any contamination of the lateral surface of the detector.

In another embodiment the pin is rigidly secured to the bottom of the boxlike holder. This embodiment has the advantage that the weight of the assembly is reduced and that connection means outside the envelope can be prevented.

The pins may either consist of metal or be insulating, in which latter case they consist in particular of a ceramic material. In the first case, the pin may be used as an electric connection element in addition to performing its connection and centring function. The second case is of advantage in applications in which metal parts have to be reduced to a minimum so as to prevent the phenomenon of retrodiffusion.

The pin may be tubular in which its weight remains low while nevertheless the rigidity is maintained. In addition the tubular pin may be slightly conical to facilitate a rigid connection of the crystal.

If the cavity in the crystal is in the form of a continuous bore, at least one electric connection element which connects one of the zones of the crystals to a current supply conductor of the detector is preferably passed through the cavity in the crystal and through the tubular pin.

Figure 2:
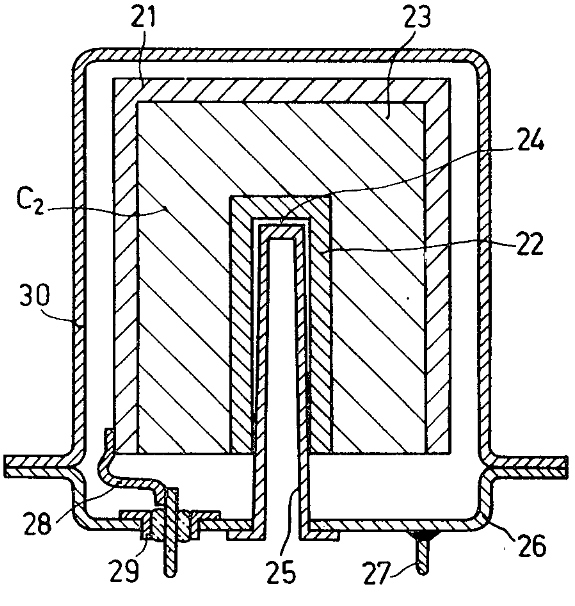

In order that the invention may be readily carried into effect, a few embodiments of the detector according to the invention will now be described in greater detail with reference to the accompanying drawings, in which:

FIGS. 1 and 2 each show an embodiment of the detector according to the invention.

The crystal $C_1$ of the detector shown in FIG. 1 comprises two coaxial semiconductor layers 1 and 2 of opposite conductivity types separated by an intrinsic layer 3. The crystal comprises a continuous central cavity 4 in which a pin *5a* is forcibly guided, the end of the pin *5a* present outside the cavity 4 changing into a disk *5b*.

In order to reinforce the connection between the crystal C1 and the pin *5a*, the pin may be slightly conical or, if desirable, be formed as a cylindrical tube which comprises slots over at least a part of its length to give it a certain elasticity and to lock it in suitable manner with respect to the internal layer 2, for example, by means of a locking member, or normally by clamping action.

Prior to inserting the pin *5a* in the cavity 4, a ring 6 of an insulating material which is destined to serve as an adjusting ring for the detector is placed on the disk *5b*. This adjusting ring is not always necessary and it may be omitted when the diameter of the central cavity 4 and the diameter and the shape of the pin *5a* are chosen in a mutually suitable manner.

The crystal C1 of the detector is held by the pin *5a* and the disk *5b* and the assembly is placed in a metal boxlike holder 7 to which it is rigidly secured by means of a clamping ring 8 arranged on the outside of the holder at the height of the disk *5b*, which latter is forcibly inserted into the holder 7.

The pin *5a* and the disk *5b* may be used to obtain an electric connection between the inner layer 2 of the crystal and the supply wire 9, the supply wire 9 being directly welded to the boxlike holder 7. In the case in which the pin *5a* and the disk *5b* are of metal it is sufficient to choose a metal having good electrically conductive properties, for example, aluminum. In the case in which the pin *5a* and the disk *5b* consist of an insulating material, for example, a ceramic material, it is sufficient to metallize the outer surfaces prior to inserting the crystal into the holder.

The pin *5a* and possibly the disk *5b* may consist of the same material as the material of the crystal. This embodiment is useful in particular in the case in which the coefficients of expansion of the various materials have to correspond considerably, or have to be equal so as to be able to use the detector in the case of extreme temperature conditions.

The electric connection to the outer layer 1 of the crystal is obtained by a conductor 10, which is passed, for example, through the central cavity 4 and through the pin *5a* without, however, contacting the cavity 4 or the pin *5a*. The conductor 10 is connected to a current supply wire which is passed through the bottom of the holder 7 in an insulated manner opposite to the pin *5a*.

A cover 12 which is hermetically sealed to the holder 7 consists of a metal or of an insulating material, for example, a ceramic material.

The crystal C2 of the detector shown in FIG. 2 comprises semiconductor layers 21 and 22 of opposite conductivity types and an intrinsic layer 23. This crystal comprises a blind hole 24 in which the inner layer 22 forms the wall of said hole. The outer layer 21 envelops the outer wall of the crystal C2. The crystal is connected with its central cavity to a pin 25 which is forcibly inserted in the cavity. The pin which may consist, for example, of metal, is conical and is directly soldered to the bottom of the holder 26.

As in the detector shown in FIG. 1, the electric connection between the layer 22 and the current supply wire 27 which is welded to the holder 26 is formed by the pin 25. The electric connection to the layer 21 is obtained by a connection conductor 28 which is soldered to the layer 21 and which is guided through the holder 26 by means of a glass-metal lead-in member.

Dependent upon its application, the cover 30 consists of metal or of an insulating material. The cover is welded, for example, to the holder 26 if it consists of metal, or is hard-soldered if it consists of an insulating material, for example, a ceramic material.

The detector according to the invention described in the two examples shown has the great advantage of leaving the lateral walls entirely free, as a result of which a very efficaceous effect is obtained in particular in those applications in which the said lateral walls are subjected to a radiation, for example, in the case of application as a probe.

What is claimed is:

1. A radiation detector comprising a semiconductor crystal having a centrally located cavity, said crystal having two zones of opposite conductivity types, a hermetically sealed envelope adapted to enclose said crystal, said envelope comprising a cover and a boxlike holder, and means to secure said crystal in said envelope comprising a rigid pin being attached to said holder and pressing against said crystal from within said cavity.

2. A radiation detector as claimed in claim 1 wherein the end of the pin outside the cavity is rigidly secured to a disk which extends at right angles to the pin and is secured to the boxlike holder.

3. A radiation detector as claimed in claim 1, wherein the pin is rigidly secured to the bottom of the boxlike holder.

4. A radiation detector as claimed in claim 1, wherein the pin is tubular.

5. A radiation detector as claimed in claim 4, wherein the tubular pin is conical.

6. A radiation detector as claimed in claim 4 wherein the cavity in the crystal is formed as a continuous bore and at least one electric connection element which connects one of the zones of the crystal to a current supply conductor for the operation of the detector is passed through the cavity in the crystal and through the tubular pin.

7. A radiation detector as claimed in claim 1, wherein the pin has a conductive part which makes a conductive contact with one of the zones of the crystal.

* * * * *